United States Patent
Park

(10) Patent No.: US 7,838,440 B2
(45) Date of Patent: Nov. 23, 2010

(54) METHOD FOR MANUFACTURING SEMICONDUCTOR DEVICE HAVING POROUS LOW DIELECTRIC CONSTANT LAYER FORMED FOR INSULATION BETWEEN METAL LINES

(75) Inventor: Chang Soo Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 44 days.

(21) Appl. No.: 11/966,282

(22) Filed: Dec. 28, 2007

(65) Prior Publication Data

US 2008/0318430 A1 Dec. 25, 2008

(30) Foreign Application Priority Data

Jun. 21, 2007 (KR) ........................ 10-2007-0061245

(51) Int. Cl.
*H01L 21/31* (2006.01)
*H01L 21/4763* (2006.01)

(52) U.S. Cl. .................... 438/780; 438/618; 438/622; 438/623; 438/624; 438/778; 257/758; 257/759; 257/E21.581

(58) Field of Classification Search ................. 438/780
See application file for complete search history.

(56) References Cited

U.S. PATENT DOCUMENTS

| | | | | |
|---|---|---|---|---|
| 6,143,646 | A * | 11/2000 | Wetzel | 438/637 |
| 6,211,061 | B1 * | 4/2001 | Chen et al. | 438/622 |
| 6,251,770 | B1 * | 6/2001 | Uglow et al. | 438/624 |
| 6,528,409 | B1 * | 3/2003 | Lopatin et al. | 438/618 |
| 6,984,579 | B2 * | 1/2006 | Nguyen et al. | 438/622 |
| 7,087,998 | B2 * | 8/2006 | Lee et al. | 257/750 |
| 7,233,071 | B2 * | 6/2007 | Furukawa et al. | 257/759 |
| 7,301,191 | B1 * | 11/2007 | Tombler et al. | 257/296 |
| 7,312,531 | B2 * | 12/2007 | Chang et al. | 257/770 |
| 7,329,458 | B2 * | 2/2008 | Hiraoka et al. | 428/318.4 |
| 7,391,115 | B2 * | 6/2008 | Usami et al. | 257/760 |
| 2004/0014273 | A1 * | 1/2004 | Bhattacharyya et al. | 438/207 |
| 2005/0255613 | A1 * | 11/2005 | Kim et al. | 438/20 |
| 2008/0214910 | A1 * | 9/2008 | Buck | 600/310 |

FOREIGN PATENT DOCUMENTS

KR 1020040002894 1/2004

OTHER PUBLICATIONS

J.H. Choi et. al, "Fabrication of carbon nanotube emitter on the flexible substrate", Aug. 31, 2005, Diamond and Related Materials, 15, p. 44-48.*
Hiroyuki Takeda et. al, "Electronic band structures of carbon nanotubes with nanoscale periodic pores", Nov. 28, 2002, Journal of Physics D: Applied Physics, 35, p. 3225-3228.*
Cattien V. Nguyen et. al, "Preparation of Nucleic Acid Functionalized Carbon Nanotube Arrays", Aug. 24, 2002, Nano Letters, vol. 2, No. 10, p. 1079-1081.*
Peter Singer; "Low k Dielectrics: The Search Continues", Semiconductor International, May 1996, pp. 88-96.

* cited by examiner

*Primary Examiner*—Savitri Mulpuri
*Assistant Examiner*—Pape Sene
(74) *Attorney, Agent, or Firm*—Ladas & Parry LLP

(57) ABSTRACT

The present invention related to a method for manufacturing a semiconductor device. More particularly, this method describes how to manufacture a semiconductor device having a porous, low dielectric constant layer formed between metal lines, comprising an insulation layer enveloping fillers.

11 Claims, 3 Drawing Sheets

_US 7,838,440 B2_

METHOD FOR MANUFACTURING SEMICONDUCTOR DEVICE HAVING POROUS LOW DIELECTRIC CONSTANT LAYER FORMED FOR INSULATION BETWEEN METAL LINES

CROSS-REFERENCE TO RELATED APPLICATIONS

The present application claims priority to Korean patent application number 10-2007-0061245 filed on Jun. 21, 2007, which is incorporated herein by reference in its entirety.

BACKGROUND OF THE INVENTION

The present invention relates generally to a method for manufacturing a semiconductor device, and more particularly, to a method for manufacturing a semiconductor device which has a porous low dielectric constant layer formed for insulation between metal lines.

Memory cells are formed to have a stacked structure as the degree of integration of a semiconductor memory device increases and the demand for a semiconductor memory device operating at a high speed increases. In addition, metal lines for electrical connection of the respective cells are also formed to have a multi-layered structure allowing easy design of a wiring system.

Traditionally, a silicon oxide layer has been used as an insulation material for insulation between metal lines. In this regard, as the semiconductor devices are designed for higher integration and higher speed operation, the parasitic capacitance between metal lines has increased;, and the silicon oxide layer has served as a factor for retarding the increase of the driving speed. With this in mind, in the recent semiconductor manufacturing processes, a porous low dielectric constant layer having a low dielectric constant (low k value) no greater than 2.5 has been used as an insulation material for insulation between metal lines. Due to the fact that a dielectric constant k decreases as the size of a pore increases, the porous low dielectric constant layer reduces parasitic capacitance between metal lines, and therefore, increases the operating speed of a semiconductor device.

Hereinbelow, a conventional method for manufacturing a semiconductor device having a porous low dielectric constant layer formed for insulation between metal lines will be described with reference to FIG. 1.

Referring to FIG. 1, an insulation layer 110 and a lower metal line 120 are formed on a semiconductor substrate 100. A porous low dielectric constant layer 130 is formed on the insulation layer 110 including the lower metal line 120 as an interlayer insulation material. By etching the porous low dielectric constant layer 130, a trench is defined for forming an upper metal line, which includes a via-hole for exposing the lower metal line 120. A diffusion barrier 140 is formed on the porous low dielectric constant layer 130 including the surfaces of the via-hole and the trench. A metal layer for a metal line, such as a copper layer, is deposited on the diffusion barrier 140 to fill the via-hole and the trench. An upper metal line 50, which comes into contact with the lower metal line 120, is formed by CMPing (chemically and mechanically polishing) the copper layer and the diffusion barrier 140 to expose the porous low dielectric constant layer 130.

However, since the conventional porous low dielectric constant layer 130 has a low Young's modulus, voids V are likely to be generated and grow therein while subsequent processes are implemented, as shown in FIG. 1. Due to the presence of the voids V, defects can be caused in a semiconductor device.

In detail, it is the norm that annealing is implemented before conducting a CMPing process for the copper layer. During annealing, the semiconductor substrate 100 receives a thermal stress. The thermal stress applied to the semiconductor substrate 100 can result in the deformation of the porous low dielectric constant layer 130 while subsequent processes are implemented. As a consequence, the voids V are likely to be generated in the porous low dielectric constant layer 130.

The voids V, which are generated due to the thermal stress, can serve as a factor for decreasing the hardness of the porous low dielectric constant layer 130. The voids V continuously grow while subsequent semiconductor manufacturing processes and testing processes are implemented so that cracks can occur in the metal lines. Therefore defects can be caused in a semiconductor device and the manufacturing yield can decrease.

The defects resulting from the presence of the voids V can be caused in the same manner in the case where an aluminum layer is used as the material for the metal lines.

SUMMARY OF THE INVENTION

An embodiment of the present invention is directed to a method for manufacturing a semiconductor device having a porous low dielectric constant layer formed for insulation between metal lines. This prevents voids from forming in the porous low dielectric constant layer.

Also, an embodiment of the present invention references a method for manufacturing a semiconductor device having a porous low dielectric constant layer formed for insulation between metal lines, which can improve the mechanical strength of the porous low dielectric constant layer.

In one aspect, a method for manufacturing a semiconductor device comprises the step of forming a porous low dielectric constant layer for insulation between metal lines, wherein the porous low dielectric constant layer comprises an insulation layer including fillers.

The fillers are a solid type.

The fillers comprise carbon or silicon.

The carbon has the shape of nanotubes or granules each of which has a plurality of pores.

The silicon is formed through electrochemical etching of a silicon wafer in an HF solution to have a plurality of pores.

A size of the pores in the silicon is controlled through adjustment of a density of a current applied in the electrochemical etching, a composition of an electrolyte, an etching time, and a doping concentration of a silicon substrate.

The porous low dielectric constant layer is formed through any one of a spin coating process, an ALD process and a CVD process.

Forming the porous low dielectric constant layer through the spin coating process comprises the steps of mixing fillers in an SOG-based or an organic polymer-based insulation layer; spin-coating the insulation layer having the fillers mixed therein; and backing the spin-coated insulation layer having the fillers mixed therein.

Forming the porous low dielectric constant layer through the ALD process or the CVD process comprises the steps of forming fillers; and depositing an organic or inorganic-based insulation layer on the fillers.

The porous low dielectric constant layer is formed to have a double-layered structure.

The porous low dielectric constant layer having the double-layered structure is formed such that an upwardly positioned layer has a lower dielectric constant than a downwardly positioned layer.

In another aspect, a method for manufacturing a semiconductor device comprises the steps of forming a porous low dielectric constant layer including fillers, on a semiconductor substrate which is formed with a lower metal line; etching the porous low dielectric constant layer, and thereby exposing the lower metal line and defining a metal line forming region in which an upper metal line is to be formed; and filling a metal layer in the metal line forming region and thereby forming an upper metal line which comes into contact with the lower metal line.

The fillers are a solid type.

The fillers comprise carbon or silicon.

The carbon has the shape of nanotubes or granules each of which has a plurality of pores.

The silicon is formed through electrochemical etching of a silicon wafer in an HF solution to have a plurality of pores.

A size of the pores in the silicon is controlled through adjustment of a density of a current applied in the electrochemical etching, a composition of an electrolyte, an etching time, and a doping concentration of a silicon substrate.

The porous low dielectric constant layer is formed through any one of a spin coating process, an ALD process and a CVD process.

Forming the porous low dielectric constant layer through the spin coating process comprises the steps of mixing fillers in an SOG-based or an organic polymer-based insulation layer; spin-coating the insulation layer having the fillers mixed therein; and backing the spin-coated insulation layer having the fillers mixed therein.

Forming the porous low dielectric constant layer through the ALD process or the CVD process comprises the steps of forming fillers; and depositing an organic or inorganic-based insulation layer on the fillers.

The porous low dielectric constant layer is formed to have a double-layered structure.

The porous low dielectric constant layer having the double-layered structure is formed such that an upwardly positioned layer has a lower dielectric constant than a downwardly positioned layer.

Before the step of a porous low dielectric constant layer including fillers, the method further comprises the step of forming an insulation layer not including fillers, on the semiconductor substrate which is formed with the lower metal line.

DESCRIPTION OF SPECIFIC EMBODIMENT

In the present invention, a porous low dielectric constant layer is formed to include fillers such as carbon or silicon. The fillers are evenly distributed in the porous low dielectric constant layer, and pores are formed where the fillers are not present. Therefore, contrary to conventional porous low dielectric constant layer not including fillers, the growth of pores are limited to some extent in the porous low dielectric constant layer including the fillers according to the present invention.

Accordingly, in the porous low dielectric constant layer including the fillers in the present invention, when compared to the conventional porous low dielectric constant layer as a single molecule of an organic, inorganic or polymer type, the size of the pores contained in the layer decreases, and the total pore volume can be maintained. In particular, a mechanical strength of the layer can be improved to the same level as that of a silicon oxide layer.

As a result, it is possible to prevent defects such as cracks from being caused due to a thermal stress and the manufacturing yield from decreasing in the present invention, by using the porous low dielectric constant layer including the fillers as an interlayer insulation material.

Hereafter, a specific embodiment of the present invention will be described in detail with reference to the attached drawings.

Figure 1:
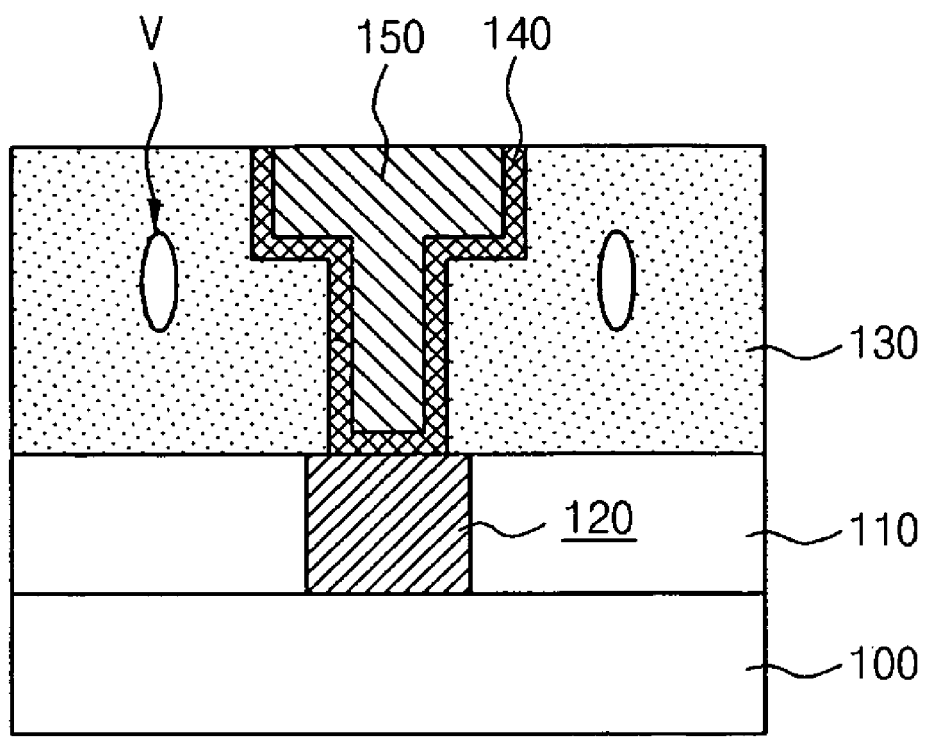
FIG. 1 is a cross-sectional view explaining a conventional method for manufacturing a semiconductor device.
Figure 2A:
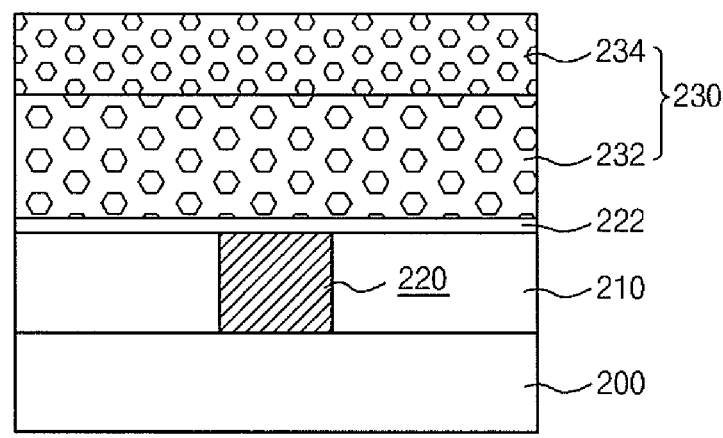
FIGS. 2A and 2B are cross-sectional views illustrating the processes of a method for manufacturing a semiconductor device in accordance with an embodiment of the present invention.
Figure 2B:
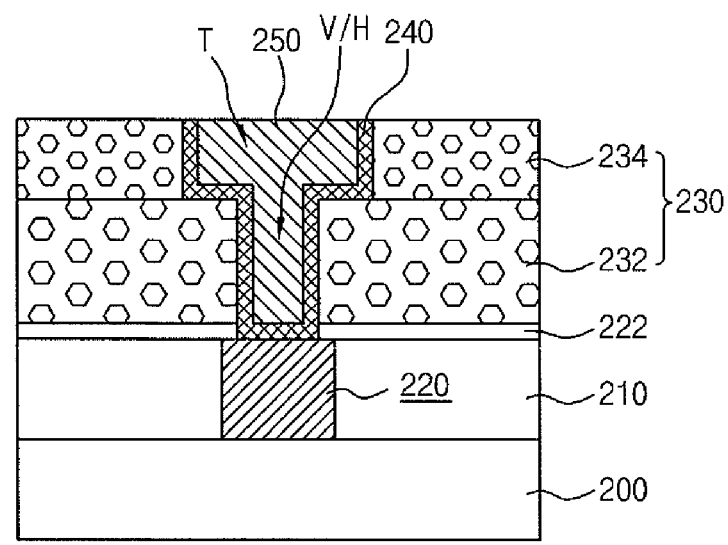

FIGS. 2A and 2B are cross-sectional views illustrating the processes of a method for manufacturing a semiconductor device having a porous low dielectric constant layer formed for insulation between metal lines in accordance with an embodiment of the present invention.

Referring to FIG. 2A, an insulation layer 210 is formed on a semiconductor substrate 200 which is formed with a predeposition layer (not shown) including transistors. By etching the insulation layer 210, a trench is defined. A metal layer for a metal line is formed on the insulation layer 210 to fill the trench. By removing a portion of the metal layer for a metal line formed on the insulation layer 210 through a CMP (chemical and mechanical polishing) process, a lower metal line 220 is formed in the trench. After depositing a porous low dielectric constant layer 230 on the insulation layer 210 including the lower metal line 220, the surface of the porous low dielectric constant layer 230 is planarized.

The porous low dielectric constant layer 230 is formed as a double-layered structure including a first porous low dielectric constant layer 232 and a second porous low dielectric constant layer 234. A via contact is formed in the first porous low dielectric constant layer 232 located downward and an upper metal line is formed in the second porous low dielectric constant layer 234 located upward. As such, the second porous low dielectric constant layer 234 located upward is formed to have a dielectric constant that is less than that of the first porous low dielectric constant layer 232 located downward.

The porous low dielectric constant layer 230 is formed as an insulation layer which includes solid type fillers (not shown in FIGS. 2A and 2B). The porous low dielectric constant layer 230 including the fillers is formed through a spin coating process, known as either an ALD (atomic layer deposition) process or a CVD (chemical vapor deposition) process. In the case of using the spin coating process, fillers are mixed in an inorganic or organic SOG-based or an organic polymer-based insulation layer which has the same or similar properties to the insulation layers having product names, SiLK, T-22, FOX, Type-12, HSG-R7, Type-9, T-18, HOSP, FLARE, Cyclotone, Velox, Alcap, PQ-600 and PQ-100. The insulation layer having the fillers mixed therein is then spin coated and the resultant layer is baked, whereby the formation of the porous low dielectric constant layer 230 including the fillers is completed. In the case of using an ALD process or a CVD process, after fillers are formed, an organic or inorganic insulation layer, is deposited on the fillers, whereby the formation of the porous low dielectric constant layer 230 including the fillers is completed. The organic or inorganic insulation layer has the same or similar properties to SiOF, SiOB, SiOC, SiCOH, BN, and the insulation layers have product names, Parylene-N, Black-Diamond, Flow Fill, Parylene-F, a-CF, NCS, ST-F2000, Nautilus, Cytop and ELK-FLARE, and $SiO_2$, SiN and SiC.

In the present invention, carbon or silicon, are used as the fillers. They contain a large amount of fine pores and can be easily adjusted in the porosity thereof.

TABLE 1

Coefficient of Thermal Expansion (CTE) & Young's Modulus according to material species

| Material | CTE (ppm/° C.) | Young's Modulus (GPa) |
|---|---|---|
| Aluminum | 23 | 80 |
| Copper | 17 | 104 |
| Ta | 6.5 | 185 |
| Carbon | | >1000 |
| Silicon | 3 | 131 |
| SiO2 | 66 | 57 |
| SILK | 30 | 2-3 |
| Coral | | 9.5 |
| SiNx | | 166 |
| SiCN | 16.5 | 67 |

Apparent from Table 1, the strength of the porous low dielectric constant layer is significantly improved since carbon or silicon has a Young's modulus that is greater than those of other materials for a porous low dielectric constant layer in the event that the fillers comprising carbon or silicon are included in the porous low dielectric constant layer. For example, if carbon is included in the insulation layer, carbon is present in the shape of nanotubes or granules, and the insulation layer including carbon has the properties of the porous low dielectric constant layer having a low dielectric constant and at the same time, improved mechanical strength.

Apparent from Table 2 below, when carbon is used as the fillers, a common carbon substance, can be appropriately selected and used. Table 2 shows pore sizes and total pore volumes according to active carbon species.

TABLE 2

Pore property & Surface Area according to active Carbon species

| Carbon Type | Total Pore Vol. (ml/g) | Average Pore radius (nm) | Surface Area ($m^2/g$) |
|---|---|---|---|
| Coconut Shell | 0.5~0.6 | 1.0~1.1 | 1000~1100 |
| Peat | 0.6~1.2 | 1.1~2.6 | 900~1275 |
| Bituminous Coal | 0.6~0.8 | 1.2~1.6 | 900~1150 |
| Lignite Coal | 0.9~1.0 | 2.9~3.2 | 600~675 |
| Wood (Chemically Activated) | 1.4~1.8 | 2.2~2.6 | 1200~1600 |

Figure 3:
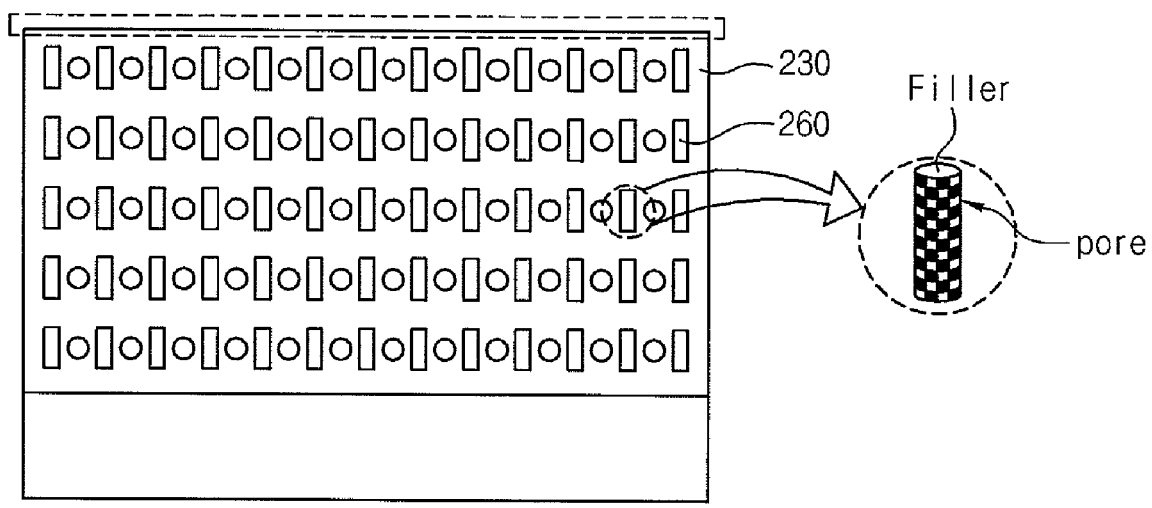
FIG. 3 is a view illustrating a porous low dielectric constant layer containing nanotube type carbon substances as fillers according to the embodiment of the present invention.

FIG. 3 is a view illustrating the porous low dielectric constant layer containing a nanotube type carbon substance.

Referring to FIG. 3, in the case of the porous low dielectric constant layer 230 including the nanotube type carbon as fillers 260, due to the presence of the evenly distributed nanotube type carbon, pores of fine sizes can grow. Also, pores having small sizes grow uniformly.

Accordingly, in the porous low dielectric constant layer 230 including the plurality of fillers 260 according to the present invention, as the size of the pores decreases, the surface quality of the layer can be improved.

In the case of using silicon as the fillers, the porous low dielectric constant layer is formed after obtaining porous silicon of a desired size through electrochemical etching of a silicon wafer in an HF solution, by including the porous silicon in an insulation layer. Here, the porous structure of silicon can be changed by adjusting the density of an applied current, the composition of an electrolyte, an etching time, and the doping concentration in a silicon substrate. For example, by decreasing the density of an applied current and the concentration of the HF solution, the maximum size of the pores can be increased. Hence, a desired porosity of porous silicon is obtained by adjusting the density of an applied current, the composition of an electrolyte, an etching time, and the doping concentration in a silicon substrate.

Meanwhile, in the present invention, in order to originally prevent electrical problems from being caused due to the fact that the fillers comprising solid type carbon or silicon are present in a semiconductor state, before forming the porous low dielectric constant layer 230, an insulation layer 222 generally known in the art is formed on the insulation layer 210 including the lower metal line 220.

Referring to FIG. 2B, a metal line forming region is defined which includes a via-hole V/H for exposing the lower metal line 220. In addition, a trench T for delimiting a region in which an upper metal line is formed. Both of these results are accomplished by etching the porous low dielectric constant layer 230 and the insulation layer 222 through a dual damascene process. A diffusion barrier 240 is formed on the porous low dielectric constant layer 230 including the via-hole V/H and the trench T, and a metal layer for a metal line. For example, a copper layer is deposited on the diffusion barrier 240 to completely fill the via-hole V/H and the trench T. an upper metal line 250 is formed by CMPing the metal layer for a metal line and the diffusion barrier 240 to expose the porous low dielectric constant layer 230.

Thereafter, while not shown in the drawings, by sequentially implementing a series of well-known subsequent processes, the manufacture of the semiconductor device according to the embodiment of the present invention is completed.

As is apparent from the above description, in the present invention, as an insulation material between metal lines, a porous low dielectric constant layer is formed such that solid type fillers having fine pores. Preferably, carbon or silicon is included in an insulation layer. In this case, since the fillers serve as barriers to the progressive growth of the pores present in the layer and function to improve the hardness of the layer, it is possible to prevent the undesired growth of the pores, the generation of voids due to a thermal stress, and the resultant occurrence of defects such as cracks while subsequent processes are implemented.

The total volume of the fine pores present in one filler is greater than the total volume of the pores which can be formed in the same space. Also, when pores are generated in the insulation layer (including the fillers) and come into contact with the fillers, the growth of the pores is necessarily limited. Therefore, the size of the pores significantly decreases when compared to the conventional art. As a consequence, according to the present invention, the porous low dielectric constant layer has a dielectric constant which is lower than that of the conventional art.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the step of:

forming a porous low dielectric constant layer for insulation between metal lines,
wherein the porous low dielectric constant layer comprises an insulation layer including fillers,
wherein the fillers comprise carbon, the carbon has the shape of nanotubes or granules each of which has a plurality of pores,
wherein the porous low dielectric constant layer is formed to have a double-layered structure, the porous low dielectric constant layer having the double-layered structure is formed such that an upwardly positioned layer has a lower dielectric constant than the downwardly positioned layer.

2. The method according to claim 1, wherein the fillers are a solid type.

3. The method according to claim 1, wherein the porous low dielectric constant layer is formed through any one of a spin coating process, an ALD process and a CVD process.

4. The method according to claim 3, wherein forming the porous low dielectric constant layer through the spin coating process comprises the steps of:
mixing fillers in an SOG-based or an organic polymer-based insulation layer;
spin-coating the insulation layer having the fillers mixed therein; and
backing the spin-coated insulation layer having the fillers mixed therein.

5. The method according to claim 3, wherein forming the porous low dielectric constant layer through the ALD process or the CVD process comprises the steps of:
forming fillers; and
depositing an organic or inorganic-based insulation layer on the fillers.

6. A method for manufacturing a semiconductor device, comprising the steps of:
forming a porous low dielectric constant layer including fillers on a semiconductor substrate which is formed with a lower metal line, wherein the fillers comprise carbon, the carbon has the shape of nanotubes or granules each of which has a plurality of pores,
wherein the porous low dielectric constant layer is formed to have a double-layered structure, the porous low dielectric constant layer haying the double-layered structure Is formed such that an upwardly positioned layer has a lower dielectric constant than a downwardly positioned layer;
etching the porous low dielectric constant layer so as to expose the lower metal line and defining a metal line forming region In which an upper metal line is to be formed; and
filling a metal layer in the metal line forming region so as to form the upper metal line which comes into contact with the lower metal line.

7. The method according to claim 6, wherein the fillers are a solid type.

8. The method according to claim 6, wherein the porous low dielectric constant layer is formed through any one of a spin coating process, an ALD process and a CVD process.

9. The method according to claim 8, wherein forming the porous low dielectric constant layer through the spin coating process comprises the steps of:
mixing fillers in an SOG-based or an organic polymer-based insulation layer;
spin-coating the insulation layer having the fillers mixed therein; and
backing the spin-coated insulation layer having the fillers mixed therein.

10. The method according to claim 8, wherein forming the porous low dielectric constant layer through the ALD process or the CVD process comprises the steps of:
forming fillers; and
depositing an organic or inorganic-based insulation layer on the fillers.

11. The method according to claim 6, wherein, before the step of forming the porous low dielectric constant layer including fillers, the method further comprises the step of:
forming an insulation layer not including fillers, on the semiconductor substrate which is formed with the lower metal line.

* * * * *